United States Patent
Kim et al.

(10) Patent No.: US 8,005,882 B2
(45) Date of Patent: Aug. 23, 2011

(54) SYSTEM AND METHOD FOR DETERMINING APPLICATION OF ADAPTIVE FILTER

(75) Inventors: Youn Ho Kim, Hwaseong-si (KR); Soo Kwan Kim, Seongnam-si (KR); Kun Soo Shin, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1091 days.

(21) Appl. No.: 11/819,477

(22) Filed: Jun. 27, 2007

(65) Prior Publication Data

US 2008/0152161 A1  Jun. 26, 2008

(30) Foreign Application Priority Data

Dec. 21, 2006  (KR) .................. 10-2006-0132214

(51) Int. Cl.
  *G06F 17/10* (2006.01)
(52) U.S. Cl. ........................................ 708/322
(58) Field of Classification Search ............. None
  See application file for complete search history.

(56) References Cited

U.S. PATENT DOCUMENTS

| | | | |
|---|---|---|---|
| 5,908,393 A | 6/1999 | Albrecht et al. | |
| 5,971,930 A | 10/1999 | Elghazzawi | |
| 6,275,592 B1 | 8/2001 | Vartiainen | |
| 2007/0280472 A1* | 12/2007 | Stokes III et al. | 379/406.01 |
| 2009/0098828 A1* | 4/2009 | Furman et al. | 455/63.1 |
| 2010/0061649 A1* | 3/2010 | Hou et al. | 382/263 |

FOREIGN PATENT DOCUMENTS

| | | |
|---|---|---|
| JP | 03-16413 | 1/1991 |
| JP | 07-134061 | 5/1995 |
| JP | 09-112241 | 4/1997 |
| JP | 10-173489 | 6/1998 |

OTHER PUBLICATIONS

Korean Office Action issued on Jul. 31, 2008 in corresponding Korean Patent Application No. 2006-0132214.

* cited by examiner

*Primary Examiner* — David H Malzahn
(74) *Attorney, Agent, or Firm* — Staas & Halsey LLP

(57) ABSTRACT

A system for determining application of an adaptive filter includes a signal sensor to sense a detection signal; an adaptive filter to filter the sensed signal adaptively; and a module for determining application of an adaptive filter to analyze the sensed signal and the filtered signal and to determine application of the adaptive filter to the sensed signal based on the analyzed result.

13 Claims, 8 Drawing Sheets

US 8,005,882 B2

SYSTEM AND METHOD FOR DETERMINING APPLICATION OF ADAPTIVE FILTER

CROSS-REFERENCE TO RELATED APPLICATIONS

This application claims priority from Korean Patent Application No. 10-2006-0132214, filed on Dec. 21, 2006, in the Korean Intellectual Property Office, the disclosure of which is incorporated herein by reference.

BACKGROUND OF THE INVENTION

1. Field of the Invention

The present invention relates to a system and method to determine application of an adaptive filter, and more particularly, to a system and method to determine application of an adaptive filter which removes noise by identifying a plurality of noise signals affecting a signal to be measured.

2. Description of the Related Art

Generally, a bio signal is a low frequency signal, and much noise occurs therein due to motion of electrodes. To remove such noise, various electrode and signal processing methods are used. In particular, a method for removing motion noise of electrodes using an acceleration signal is recently being studied by many research institutes. To this end, principal company analysis (PCA) and an adaptive filter are mainly used. However, since the PCA has limitation in that at least two channels of a signal should be measured, at least two input sensors are required. Also, the PCA requires a great amount of data to properly process data. For these reasons, the PCA is not favorable for real time processing. Also, the adaptive filter has a problem in that an output value is close to zero when a bio signal to be obtained and a noise pattern to be removed coincide with each other.

SUMMARY OF THE INVENTION

Additional aspects and/or advantages of the invention will be set forth in part in the description which follows and, in part, will be apparent from the description, or may be learned by practice of the invention.

An aspect of the present invention provides a system and method to determine application of an adaptive filter which removes noise by identifying a plurality of noise signals affecting a signal to be measured.

An aspect of the present invention also provides a system and method to determine application of an adaptive filter, in which a problem occurring, where a pattern of a bio signal coincides with that of a noise signal to be removed, is solved when the adaptive filter is used, wherein the adaptive filter enables real time processing and has an advantage of one input channel.

According to an aspect of the present invention, there is provided a system to determine application of an adaptive filter, which includes a signal sensor to sense a detection signal; an adaptive filter to filter adaptively the sensed signal; and a module for determining application of an adaptive filter, analyzing the sensed signal and the filtered signal and determining application of the adaptive filter to the sensed signal based on the analyzed result.

According to another aspect of the present invention, there is provided a method to determine application of an adaptive filter, which includes sensing a signal to be measured through various sensors; performing adaptive filtering of the sensed signal through an adaptive filter; and analyzing the sensed signal and the adaptive filtered signal and determining application of adaptive filtering to the sensed signal based on the analyzed result.

BRIEF DESCRIPTION OF THE DRAWINGS

The above and/or other aspects of the present invention will become apparent and more readily appreciated from the following detailed description, taken in conjunction with the accompanying drawings of which.

DETAILED DESCRIPTION OF THE PREFERRED EMBODIMENTS

Figure 1:
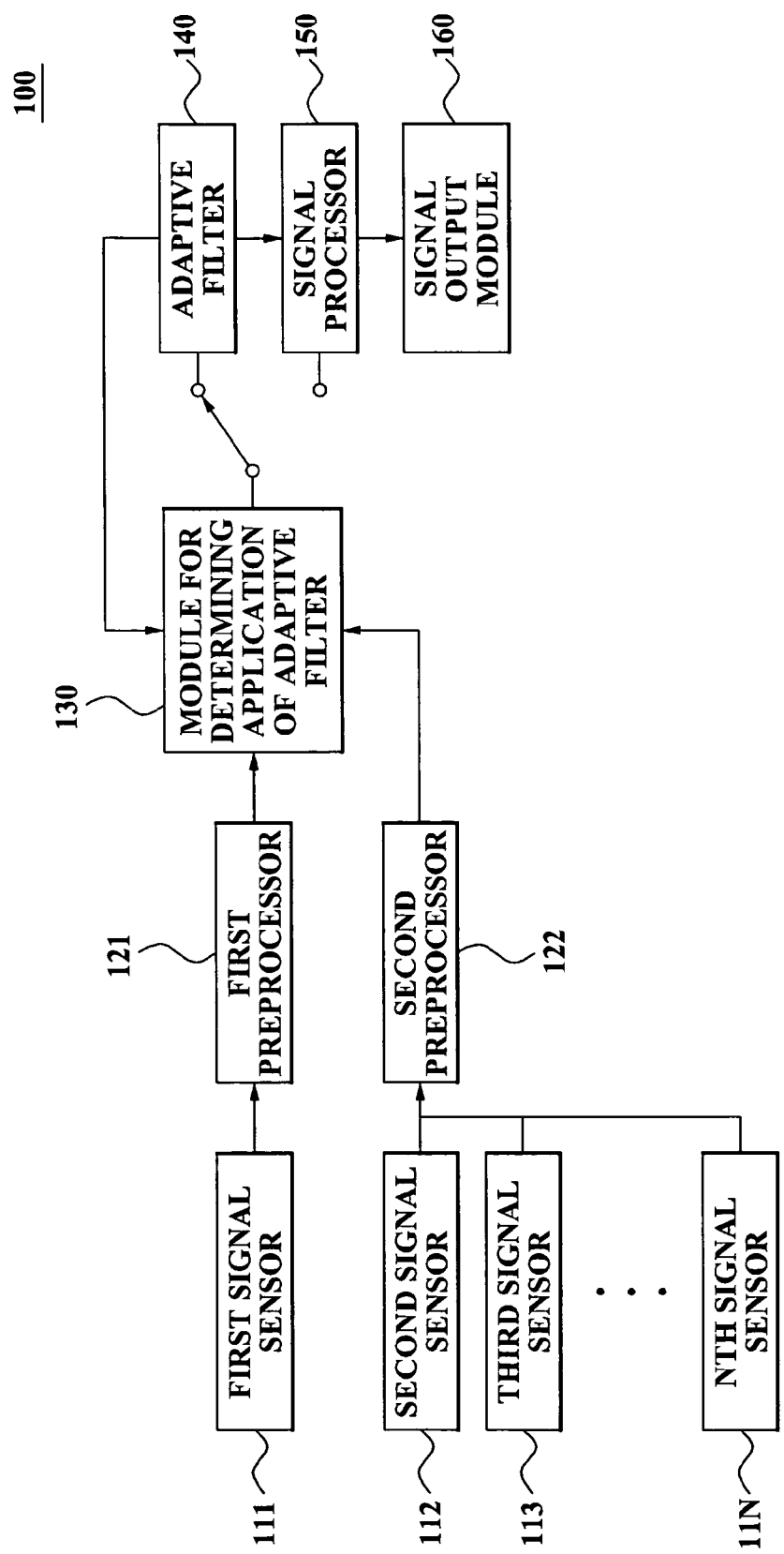
FIG. 1 illustrates a system to determine application of an adaptive filter according to one exemplary embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

An example of measuring a PPG signal in a pulsation measurement system during exercise will be described in the detailed description of the present specification.

FIG. 1 is a schematic view illustrating a system to determine application of an adaptive filter according to one exemplary embodiment of the present invention.

Referring to FIG. 1, the system 100 to determine application of an adaptive filter includes first to nth signal sensors 111 through 11n, first and second preprocessors 121 and 122, a module 130 for determining application of an adaptive filter, an adaptive filter 140, a signal processor 150, and a signal output module 160.

The first signal sensor 111 senses a first signal generated by a first object to be measured. The first signal sensor 111 senses a photoplethysmography (PPG) signal using light to sense variation in an arteriole of a living body of a user who is exercising. Specifically, the first signal sensor 111 can sense the PPG signal by fixing a PPG signal sensor to a finger of the user in a state where the user is at rest. When the PPG signal sensor is not fixed while the user exercises, a light path is varied by motion of the PPG signal sensor, whereby a signal cannot be accurately sensed. In particular, when the size of the PPG signal is weak such as a PPG signal taken at an earlobe of the user, a problem occurs in that noise caused by motion greatly affects the original signal. Accordingly, various attempts to remove such noise have been made. As an example of the attempts, noise is removed by the adaptive filter 140.

Like the first signal sensor 111, the second to the Nth signal sensors 112 through 11n sense second to Nth signals generated respectively by objects to be measured.

The first preprocessor 121 performs a preprocessing operation to amplify the first signal sensed by the first signal sensor 111. The second preprocessor 122 performs preprocessing operation to amplify the second to Nth signals sensed by the second to Nth signal sensors 112 through 11n.

Figure 2:
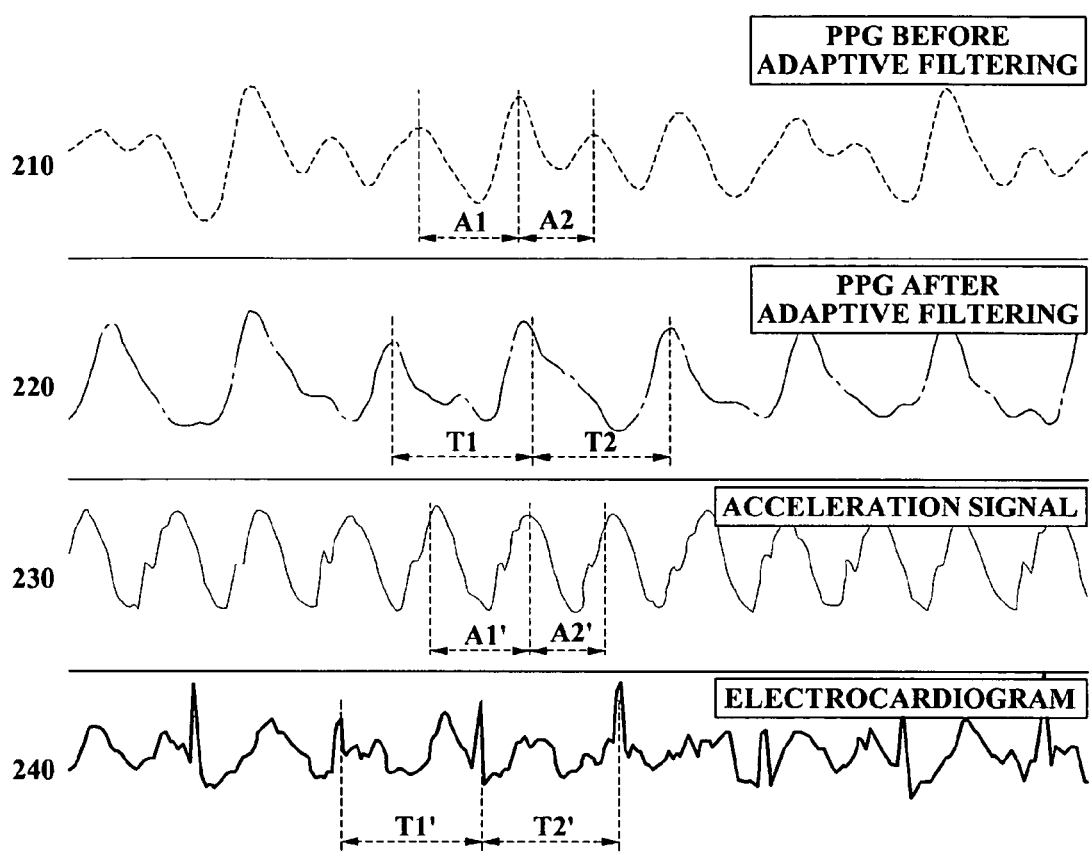
FIG. 2 illustrates the result of motion noise included in a photoplethysmography (PPG) signal and removed by an adaptive filter.

FIG. 2 illustrates the result of motion noise included in the PPG signal and removed by an adaptive filter.

Referring to FIG. 2, a signal 210 denotes the PPG signal before adaptive filtering is performed by the adaptive filter 140, and illustrates a state where distances A1 and A2 between amplitudes of the PPG signal are different from each other due to noise. A signal 220 denotes the PPG signal in which adaptive filtering is performed by the adaptive filter 140, and illustrates a state where distances T1 and T2 between amplitudes of the PPG signal are equal to each other after noise is removed.

A signal 230 denotes an acceleration signal, and illustrates a state where acceleration signal frequencies A1' and A2' are affected by the PPG signal before adaptive filtering is performed by the adaptive filter 140. Specifically, the distances A1 and A2 between the amplitudes of the PPG signal before adaptive filtering is performed by the adaptive filter 140 are directly affected by the acceleration signal, so that the acceleration signal frequencies A1' and A2' are loaded into the PPG signal to be measured.

A signal 240 denotes an electrocardiogram signal, and illustrates a state where periods of the distances A1 and A2 between amplitudes of the signal, which is loaded before adaptive filtering is performed, are removed as adaptive filtering is performed by the adaptive filter 140, and illustrates periods T1' and T2' equal to those T1 and T2 of the signal in which adaptive filtering is performed. Specifically, the periods of the distances A1 and A2 of the signal, which is loaded before adaptive filtering is performed by the adaptive filter 140, are removed, and the periods T1' and T2' of R-Peak of the electrocardiogram are illustrated equally to the periods T1 and T2 of the PPG signal in which adaptive filtering is performed.

As described above, the adaptive filter 140 can remove motion noise included in the PPG signal as adaptive filtering is performed for the PPG signal sensed by the first signal sensor 111.

However, the adaptive filter 140 has a problem in that a desired output value cannot be obtained when a pattern of an input signal to be measured coincides with that of a noise signal to be removed.

Figure 3:
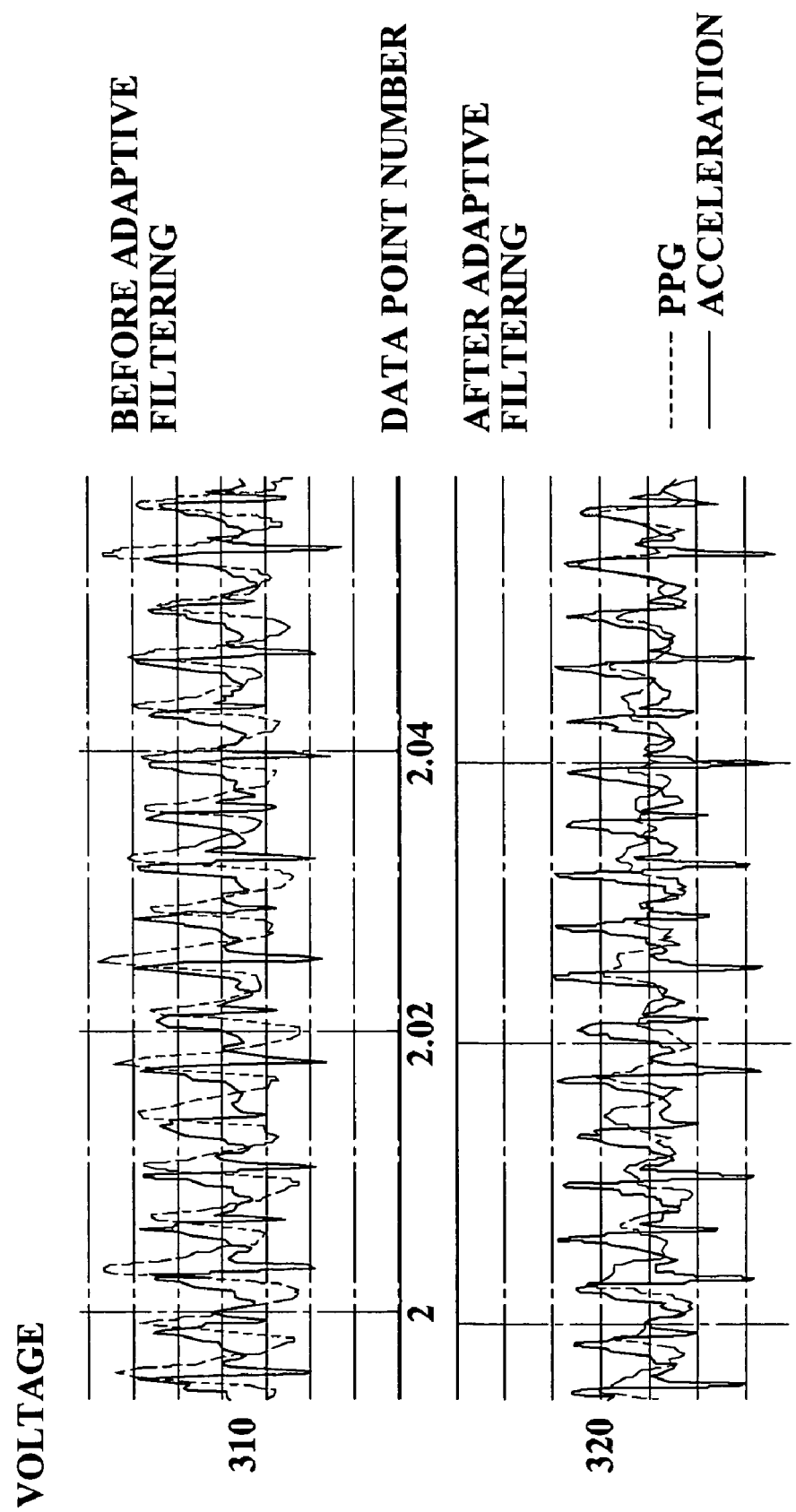
FIG. 3 illustrates an output result of an adaptive filter in a period where a pattern of a PPG signal is equal to that of a motion noise signal.

FIG. 3 illustrates an output result of an adaptive filter in a period where the pattern of the PPG signal is equal to that of a motion noise signal.

Referring to FIG. 3, a signal 310 denotes an acceleration signal and a PPG signal before adaptive filtering is performed by the adaptive filter 140, and a signal 320 denotes an acceleration signal and a PPG signal after adaptive filtering is performed by the adaptive filter 140.

As described above, in the case that the PPG signal to be measured and the acceleration signal having the motion noise signal lie in the same period, the PPG signal cannot be recovered and the PPG signal pattern is broken to obtain a signal to noise ratio (SNR) lower than that before adaptive filtering is performed, even though adaptive filtering is performed by the adaptive filter 140.

Accordingly, the operation of the module 130 for determining application of an adaptive filter is required.

Figure 4:
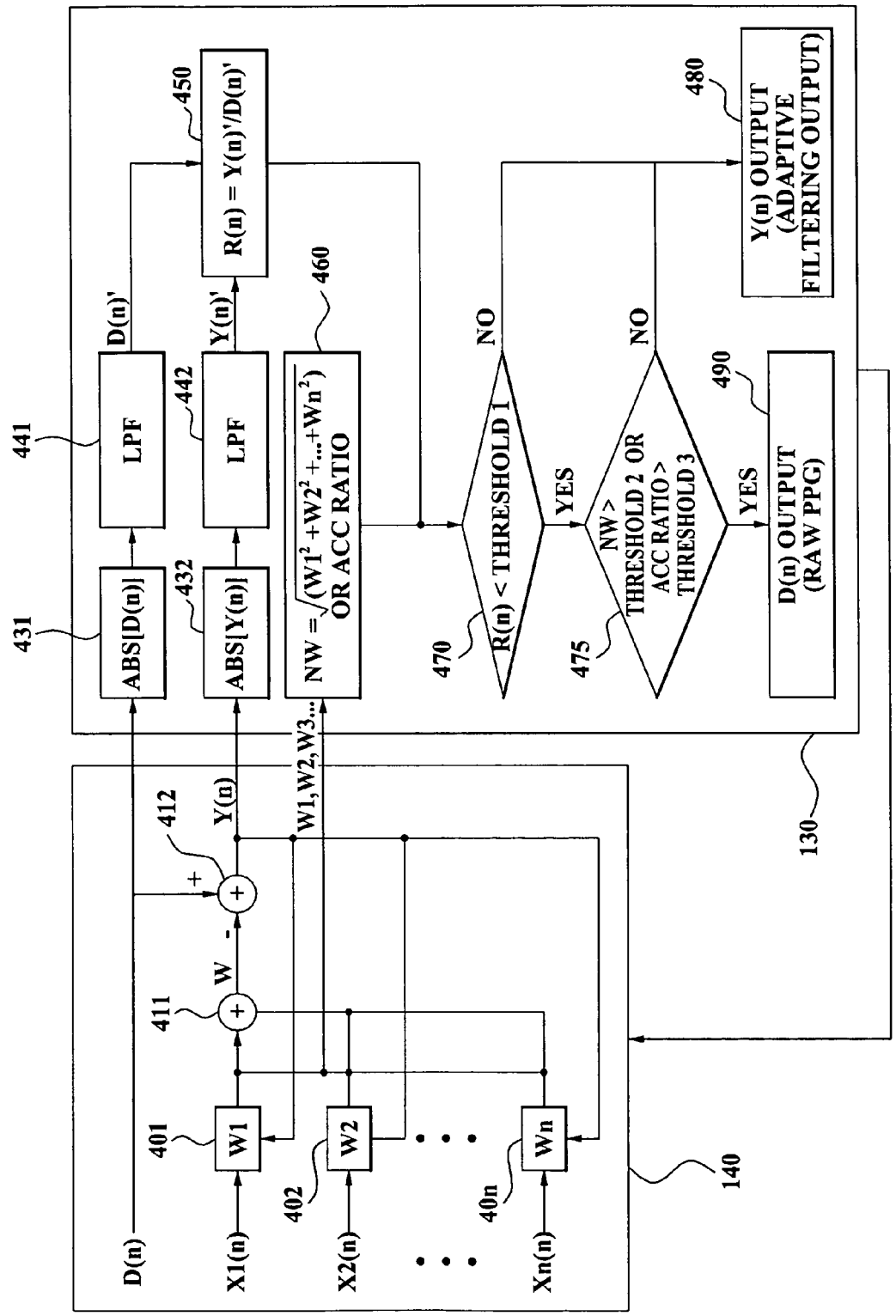
FIG. 4 illustrates an algorithm to determine application of an adaptive filter with respect to the operation of a module to determine application of an adaptive filter according to an exemplary embodiment of the present invention.

FIG. 4 illustrates an algorithm to determine application of an adaptive filter with respect to the operation of the module to determine application of an adaptive filter according to an exemplary embodiment of the present invention.

Referring to FIG. 4, the adaptive filter 140 is comprised of multi-channel adaptive filters, and receives original data D(n) and reference input values X1(n) through Xn(n) of each adaptive filter. In step 411, the adaptive filter 140 adds a value obtained by reflecting coefficients W1 through Wn 401 through 40n to the reference input values X1(n) through Xn(n) of each adaptive filter, and in operation 412, subtracts the added value from the original data D(n), whereby the resultant output value Y(n) is output.

The module 130 to determine application of an adaptive filter receives the output value Y(n) output from the adaptive filter 140, the original data D(n) input to the adaptive filter 140, and the coefficients W1 through Wn of the reference input values X1(n) through Xn(n) of the adaptive filter 140.

In operation 431, the module 130 to determine application of an adaptive filter obtains an absolute value Abs[D(n)] of the original data D(n). In operation 432, the module 130 obtains an absolute value Abs[Y(n)] of the output value Y(n).

In operation 441, the module 130 passes a low pass filter (LPF) having low pass cutoff with respect to the absolute value Abs[D(n)] of the original data or obtains a moving average value D[(n)]'. In step 442, the module 130 passes an LPF having low pass cutoff with respect to the absolute value Abs[Y(n)] of the output value Y(n) or obtains a moving average value Y[(n)]'.

In operation 450, the module 130 obtains an output ratio R(n)=Y(n)'/D(n)' with respect to the value D(n)' obtained in the operation 441 and the value Y(n)' obtained in the operation 442. The module 130 determines whether to perform the operation of the adaptive filter 140, by using the output ratio R(n).

In operation 460, the module 130 obtains NW using the following equation 1 or obtains an ACC ratio using the following equation 2.

$$NW = \sqrt{(W1^2 + W2^2 + \ldots + Wn_2)}$$ [Equation 1]

ACC ratio:X1 ratio,X2 ratio, . . . [Equation 2]

where X1 ratio:ave(abs(X1−W))/ave(abs(X1)),
X2 ratio:ave(abs(X2−W))/ave(abs(X2)),
Xn ratio:ave(abs(Xn−W))/ave(abs(Xn))
abs:absolute, ave:moving average In operation 470, the module 130 compares the output ratio R(n) with a first threshold value threshold 1 to determine whether the output ratio R(n) is less than the first threshold value threshold 1. For example, the first threshold value threshold 1 may be approximately 0.67.

Specifically, the module 130 determines that adaptive filtering is performed by the adaptive filter when the output ratio R(n) is greater than or equal to the first threshold value threshold 1 as a result of comparison between the output ratio R(n) and the first threshold value threshold 1.

Also, when the output ratio R(n) is less than the first threshold value threshold 1, the module 130 determines whether the NW is greater than a second threshold value threshold 2 or ACC ratio is greater than a third threshold 3 in operation 475. For example, the second threshold value threshold 2 may be approximately 0.7, and the third threshold value threshold 3 may be approximately 1.7.

Specifically, the module 130 determines that adaptive filtering is performed by the adaptive filter 140 when the NW is not greater than the second threshold value threshold 2 and the ACC ratio is not greater than the third threshold value threshold 3. By contrast, the module 130 determines that adaptive filtering is not performed by the adaptive filter 140 when the NW greater than the second threshold value threshold 2 or the ACC ratio is greater than the third threshold value threshold 3.

When it is determined that adaptive filtering is performed by the adaptive filter 140, in operation 480, the module 130 allows the adaptive filter 140 to output the output signal Y(n) in which adaptive filtering is performed by the adaptive filter 140.

When it is determined that adaptive filtering is not performed by the adaptive filter 140, in operation 490, the module 130 allows the adaptive filter 140 to output the original signal D(n) in which adaptive filtering is not performed by the adaptive filter 140.

The signal processor 150 performs signal processing to amplify the original signal D(n) output from the module 130 or the output signal Y(n) which is output from the adaptive filter 140 and adaptive filtered.

The signal output module 160 outputs the amplified original signal D(n) or the amplified output signal Y(n).

Figure 5:
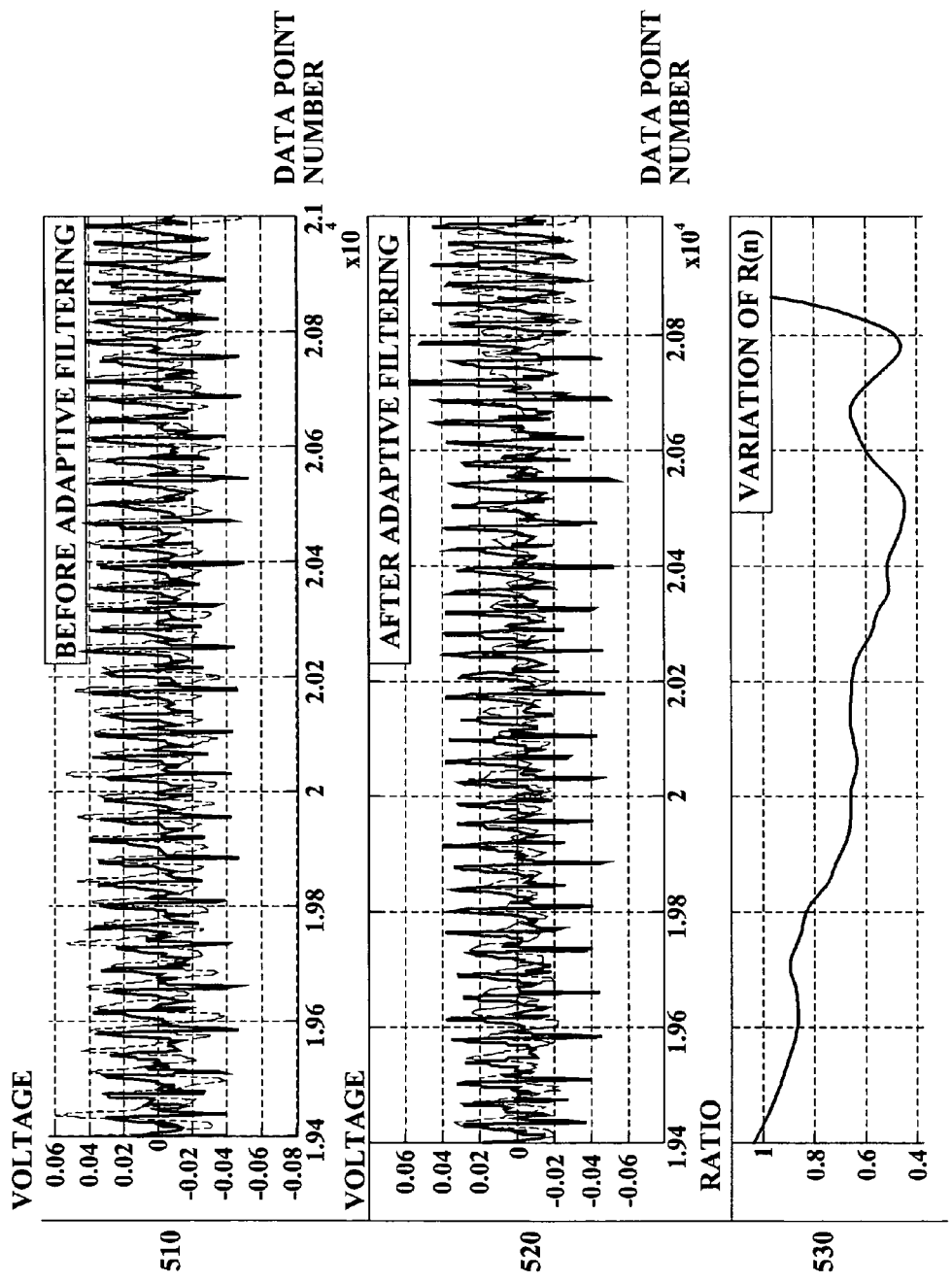
FIG. 5 illustrates variation of a value R(n) when a pattern of a signal to be measured coincides with that of a noise signal.

FIG. 5 illustrates variation of R(n) when the pattern of the signal to be measured coincides with that of the noise signal.

Referring to FIG. 5, a signal 510 denotes a signal before adaptive filtering is performed by the adaptive filter 140, a signal 520 denotes a signal after adaptive filtering is performed by the adaptive filter 140, and a signal 530 denotes variation of the output value R(n). When the pattern of the signal to be measured does not coincide with the pattern of the noise signal, the output value R(n) is close to 1. However, when not so, the output value R(n) becomes significantly small.

Therefore, the system 100 for determining application of an adaptive filter according to an exemplary embodiment of the present invention does not determine application of adaptive filtering when the output value R(n) is less than the first threshold value but determines application of an adaptive filtering when the output value R(n) is greater than or equal to the first threshold value, whereby the problem of the conventional adaptive filter is solved.

Also, even though the pattern of the signal to be measured does not coincide with that of the noise signal, a problem may occur in that the value R(n) becomes small during application of an adaptive filter when the noise signal is greater than or equal to the signal to be measured, for example, when a test subject runs. Accordingly, the module 130 obtains a value Norm($\sqrt{W1^2+W2^2+...+Wn^2}$) of the coefficients W1, W2, ..., Wn calculated in each input reference signal, i.e., the size of a coefficient vector(NW) and ACC ratio. Then, the module 130 does not perform application of adaptive filtering when the NW or the ACC ratio is greater than or equal to the second threshold value while the module 130 performs application of adaptive filtering when the NW or the ACC ratio is less than the second threshold value, whereby the above problem is solved.

Figure 6:
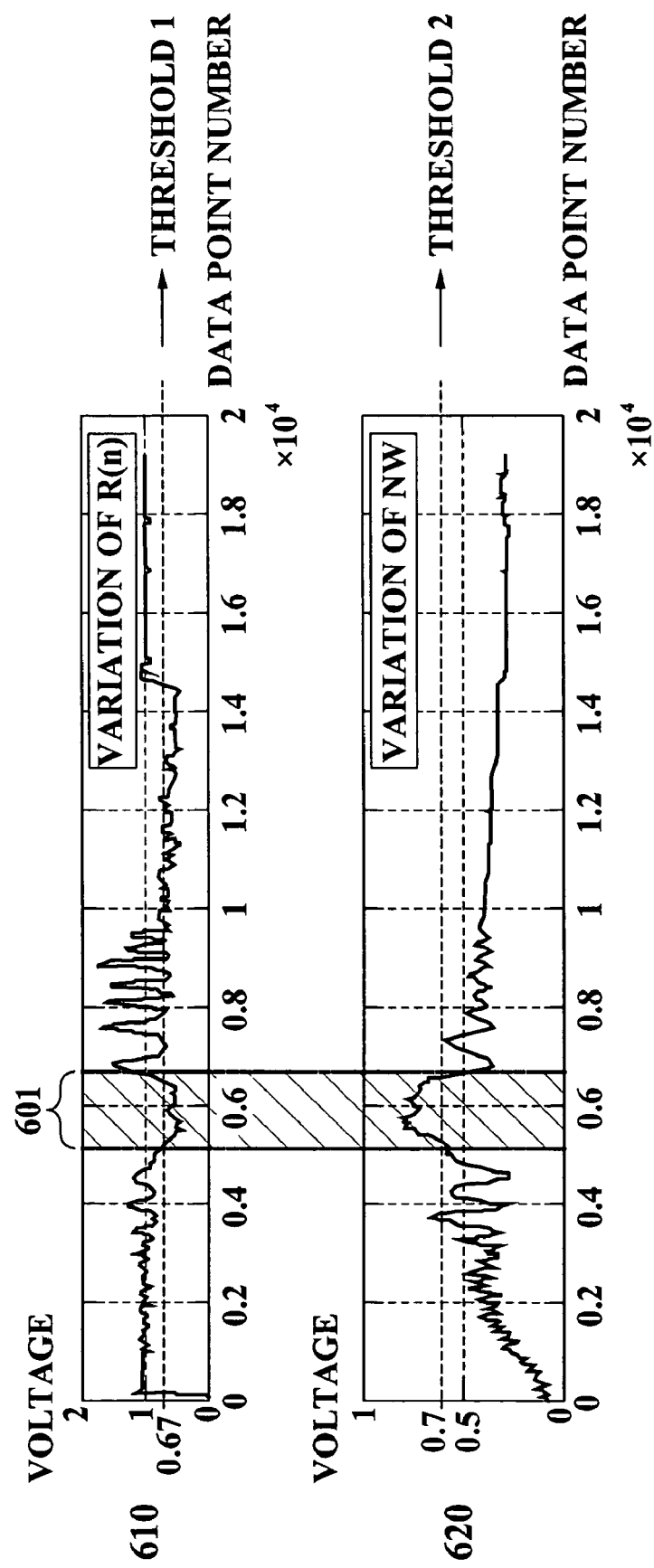
FIG. 6 illustrates an example of a variation graph of R(n) and a variation graph of NW.

FIG. 6 illustrates an example of a variation graph of R(n) and a variation graph of NW.

Referring to FIG. 6, a signal 610 denotes a variation graph of the output ratio R(n), and a signal 620 denotes a variation graph of the NW. In FIG. 6, a portion 601 denotes that the pattern of the signal to be measured coincides with that of the noise signal.

Figure 7:
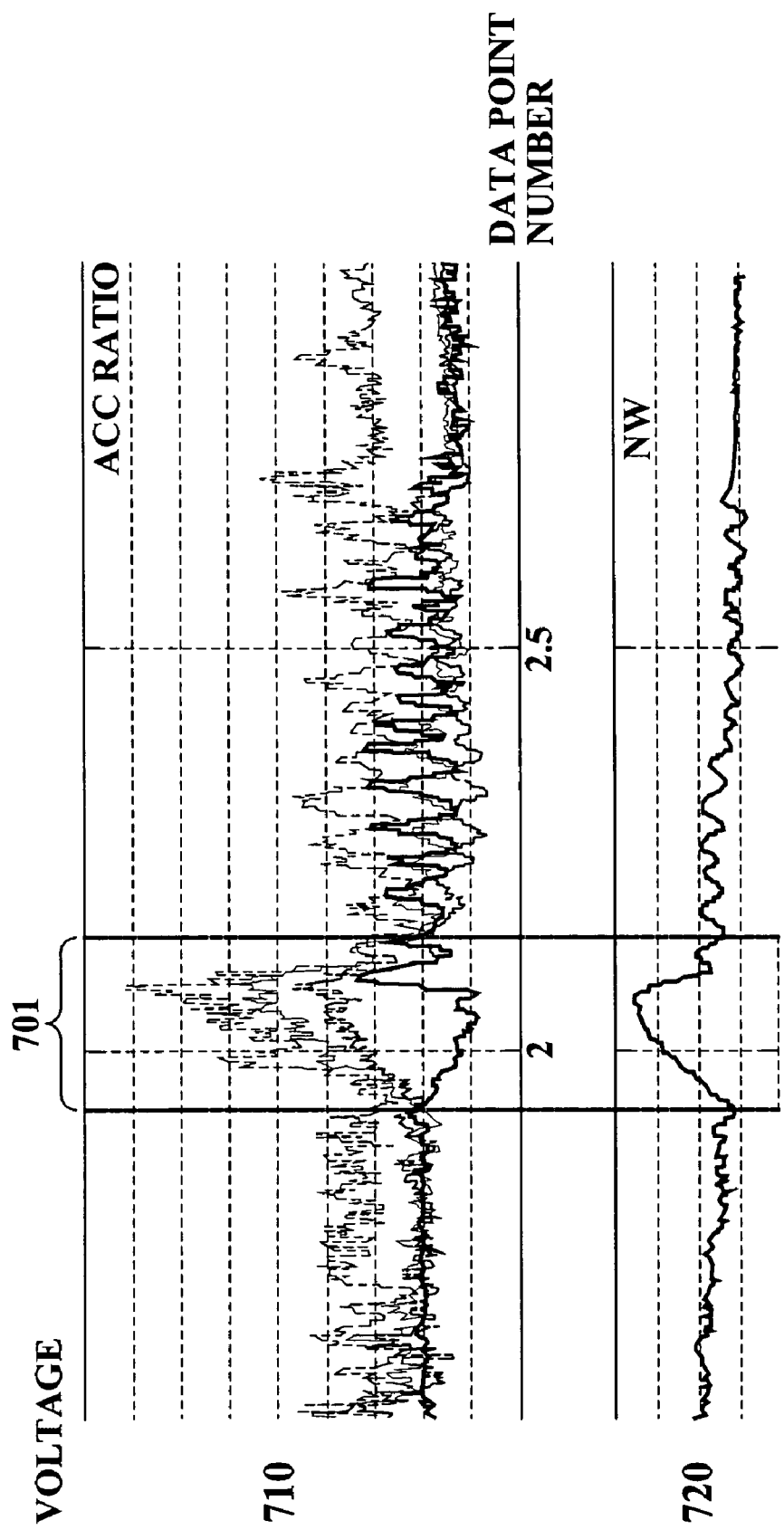
FIG. 7 illustrates an example of a variation graph of ACC rate and a variation graph of NW.

FIG. 7 illustrates an example of a variation graph of ACC rate and a variation graph of NW.

Referring to FIG. 7, a signal 710 denotes a variation graph of the ACC ratio, and a signal 720 denotes a variation graph of the NW. In FIG. 7, a portion 701 denotes that the acceleration signal is synchronized.

Figure 8:
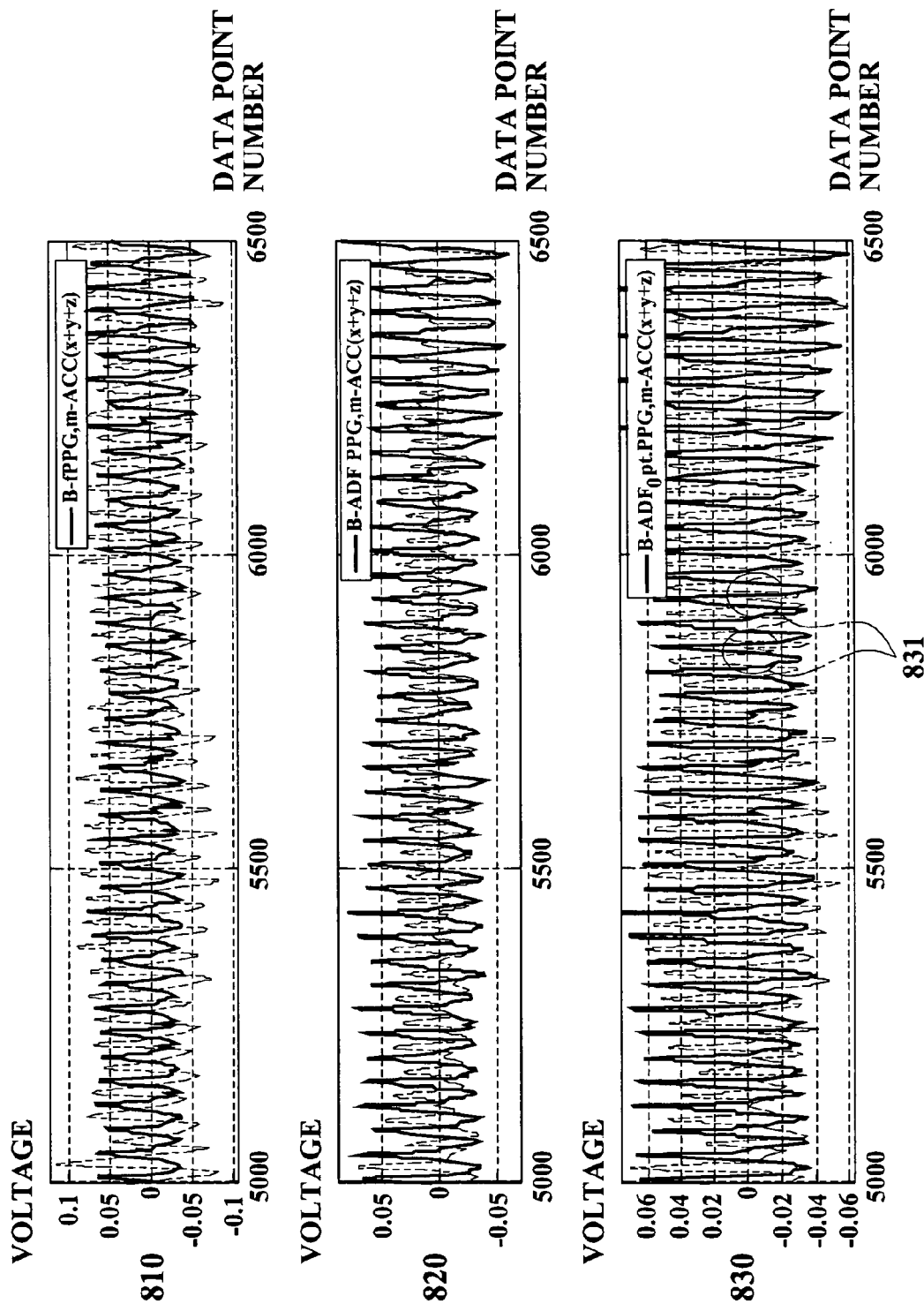
FIG. 8 illustrates an example of the result of the algorithm of a method to determine application of an adaptive filter shown in FIG. 4.

FIG. 8 illustrates an example of the result of algorithm performed by a method to determine application of an adaptive filter.

Referring to FIG. 8, a signal 810 denotes an original PPG signal, and a signal 820 illustrates the state that the original PPG signal is not recovered as adaptive filtering is performed when the pattern of the PPG signal coincides with that of the acceleration signal. A signal 830 illustrates the state that the original PPG signal is maintained as adaptive filtering is not performed when the PPG signal overlaps the acceleration signal where the algorithm performed by a method for determining application of an adaptive filter according to an exemplary embodiment of the present invention is actually used. A portion 831 denotes noise generated by on/off operation of the adaptive filter 140.

In the method to determine application of an adaptive filter according to an exemplary embodiment of the present invention, it is determined whether to perform adaptive filtering in accordance with the analysis result of the PPG signal and the acceleration signal. Thus, the SNR of the PPG signal can be improved by reflecting the original signal as is when the pattern of the PPG signal coincides with that of the acceleration signal.

Although the present invention has been described based on a pulsation measurement system during exercise, the present invention may be applied to a system which measures a low pass signal as well as the PPG signal measured by the pulsation measurement system.

Also, the method to determine application of an adaptive filter according to the above-described exemplary embodiments of the present invention can be recorded in computer-readable media including program instructions to implement various operations embodied by a computer. The media can also include, alone or in combination with the program instructions, data files, data structures, and the like. The media and program instructions can be comprised of those specially designed and constructed for the purposes of embodiments of the present invention, or they can be of a kind well-known and available to those skilled in the art of computer software. Examples of computer-readable media include but are not limited to magnetic media such as hard disks, floppy disks, and magnetic tape; optical media such as CD ROM disks and DVD; magneto-optical media such as optical disks; and hardware devices that are specially configured to store and perform program instructions, such as read-only memory (ROM), random access memory (RAM), flash memory, and the like. Examples of program instructions include both machine code, such as that produced by a compiler, and files containing higher level code that can be executed by a computer using an interpreter. The described hardware devices can be configured to act as one or more software modules in order to perform the operations of the above-described exemplary embodiments of the present invention.

An aspect of the present invention is to provide a system and method to determine application of an adaptive filter which removes noise by identifying a plurality of noise signals affecting a signal to be measured.

Another aspect of the present invention is to provide a system and method to determine application of an adaptive filter, in which a problem occurring, where a pattern of a bio signal coincides with that of a noise signal to be removed, is solved when the adaptive filter is used, wherein the adaptive filter enables real time processing and has an advantage of one input channel.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A system to determine application of an adaptive filter, comprising:
    a signal sensor to sense a signal;
    an adaptive filter to filter the sensed signal adaptively; and
    a module to perform filtering with an adaptive filter to analyze the sensed signal and the filtered signal to produce an analyzed result and to perform filtering with the adaptive filter of the sensed signal based on the analyzed result.

2. The system of claim 1, further comprising:
    a preprocessor to amplify an output of the sensed signal.

3. The system of claim 1, wherein the module to perform the adaptive filtering uses an output value $Y(n)$ of the adaptive filter, original data $D(n)$ input to the adaptive filter, and coefficients $W1$ through $Wn$ of reference input values $X1(n)$ through $Xn(n)$ of the adaptive filter, obtains absolute values Abs $[Y(n)]$ and Abs $[D(n)]$ of the output value $Y(n)$ and the original data $D(n)$ to perform low pass filtering with a low pass filter (LPF) having low pass cutoff, and obtains an output ratio $R(n)=Y(n)'/D(n)'$ of moving average values $Y(n)'$ and $D(n)'$ to determine whether to perform adaptive filtering of the adaptive filter based on the output ratio $R(n)$.

4. The system of claim 3, wherein the module to determine performing an adaptive filter determines that adaptive filtering is performed by the adaptive filter when the output ratio $R(n)$ is greater than or equal to a first threshold value.

5. The system of claim 4, wherein the module to determine perform an adaptive filter determines that adaptive filtering is performed by the adaptive filter when the output ratio $R(n)$ is smaller than the first threshold value, and NW or ACC ratio is less than a second threshold value,
    wherein the $NW=\sqrt{(W1^2+W2^2+...+Wn^2)}$ and the ACC ratio is ACC ratio:X1 ratio, X2 ratio, where X1 ratio:ave(abs(X1−W))/ave(abs(X1)),
    X2 ratio:ave(abs(X2−W))/ave(abs(X2)), . . . ,
    Xn ratio:ave(abs(Xn−W))/ave(abs(Xn))
    abs:absolute, ave:moving average.

6. The system of claim 3, wherein the module to determine application of an adaptive filter outputs either a signal $Y(n)$, in which adaptive filtering is performed by the adaptive filter, or the original data $D(n)$, based on the determined result of the module for determining application of an adaptive filter.

7. A method for determining performing an adaptive filter, comprising:
    sensing a signal to be measured through various sensors;
    performing adaptive filtering of the sensed signal using an adaptive filter; and
    analyzing the sensed signal and the adaptive filtered signal and determining whether to perform adaptive filtering of the sensed signal based on an analyzed result.

8. The method of claim 7, wherein the determining includes:
    receiving an output value $Y(n)$ of the adaptive filter, original data $D(n)$ input to the adaptive filter, and coefficients $W1$ through $Wn$ of reference input values $X1(n)$ through $Xn(n)$ of the adaptive filter;
    respectively obtaining absolute values of the output value $Y(n)$ and the original data $D(n)$;
    passing the absolute values through a low pass filter (LPF) having low pass cutoff;
    obtaining an output ratio $R(n)$ of the adaptive filter; and
    determining perform whether to perform adaptive filtering with the adaptive filter of the sensed signal based on the output ratio.

9. The method of claim 8, wherein the determining further includes determining that the adaptive filtering is performed by the adaptive filter when the output ratio $R(n)$ is greater than or equal to a first threshold value.

10. The method of claim 9, wherein the determining further includes determining that the adaptive filtering is performed by the adaptive filter when the output ratio $R(n)$ is less than the first threshold value, and NW or ACC ratio is less than a second threshold value,
    wherein the $NW=\sqrt{(W1^2+W2^2+...+Wn^2)}$ and the ACC ratio is ACC ratio:X1 ratio, X2 ratio, where X1 ratio:ave(abs(X1−W))/ave(abs(X1)),
    X2 ratio:ave(abs(X2−W))/ave(abs(X2)), . . . ,
    Xn ratio:ave(abs(Xn−W))/ave(abs(Xn))
    abs:absolute, ave:moving average.

11. The method of claim 8, further comprising either a signal $Y(n)$, in which adaptive filtering is performed by the adaptive filter, or the original data $D(n)$, based on the determined result of adaptive filtering.

12. The method of claim 8, further comprising:
    amplifying an output of the sensed signal.

13. A computer readable recording medium recording a program to implement the method of claim 7 in a computer.

* * * * *